(12) United States Patent
Miyajima

(10) Patent No.: US 7,345,737 B2
(45) Date of Patent: Mar. 18, 2008

(54) EXPOSURE METHOD AND APPARATUS HAVING A PROJECTION OPTICAL SYSTEM IN WHICH A PROJECTION GAP IS FILLED WITH LIQUID

(75) Inventor: Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 10/935,076

(22) Filed: Sep. 8, 2004

(65) Prior Publication Data

US 2005/0052632 A1     Mar. 10, 2005

(30) Foreign Application Priority Data

Sep. 9, 2003   (JP) ............... 2003-317323

(51) Int. Cl.
*G03B 27/42*   (2006.01)
*G03B 27/52*   (2006.01)

(52) U.S. Cl. .......................... 355/53; 355/30
(58) Field of Classification Search .................. 355/53, 355/77, 46, 72, 30, 55, 67
See application file for complete search history.

(56) References Cited

U.S. PATENT DOCUMENTS

| | | | | |
|---|---|---|---|---|
| 4,346,164 | A | * | 8/1982 | Tabarelli et al. ............. 430/311 |
| 5,610,683 | A | | 3/1997 | Takahashi .................... 355/53 |
| 6,262,794 | B1 | | 7/2001 | Miyajima .................... 355/53 |
| 6,266,133 | B1 | | 7/2001 | Miyajima et al. ............. 355/72 |
| 6,320,649 | B1 | | 11/2001 | Miyajima et al. ............. 355/72 |
| 6,341,007 | B1 | | 1/2002 | Nishi et al. .................. 355/53 |
| 6,400,441 | B1 | | 6/2002 | Nishi et al. .................. 355/53 |
| 6,549,269 | B1 | | 4/2003 | Nishi et al. .................. 355/53 |

(Continued)

FOREIGN PATENT DOCUMENTS

EP     0 605 103 A1   7/1994

(Continued)

OTHER PUBLICATIONS

Japanese Office Action dated May 18, 2006, issued in corresponding Japanese patent application No. 2003-317323.

*Primary Examiner*—Henry Hung Nguyen
(74) *Attorney, Agent, or Firm*—Fitzpatrick, Cella, Harper & Scinto

(57) ABSTRACT

An exposure apparatus for exposing a substrate to light via a pattern of a reticle. The apparatus includes a first substrate stage configured to hold a substrate chuck and the substrate on the substrate chuck and to move in a measurement area, a measurement unit arranged in the measurement area and configured to measure the held substrate to obtain information for positioning the substrate in an exposure area, a second substrate stage configured to hold the substrate chuck and the measured substrate on the substrate chuck, to move in the exposure area, and to position the measured substrate based on the obtained information, a projection optical system arranged in the exposure area and configured to project the pattern onto the positioned substrate while a gap between the projection optical system and the positioned substrate is filled with liquid, a conveyance unit configured to convey the substrate chuck and the measured substrate from the first substrate stage to the second substrate stage, and a supply unit arranged between the measurement area and the exposure area and configured to supply the liquid on the measured substrate.

11 Claims, 19 Drawing Sheets

U.S. PATENT DOCUMENTS

| | | |
|---|---|---|
| 6,583,859 B2 | 6/2003 | Miyajima et al. ............. 355/72 |
| 6,590,634 B1 | 7/2003 | Nishi et al. .................. 355/53 |
| 6,798,491 B2 | 9/2004 | Nishi et al. .................. 355/53 |
| 6,801,301 B2 | 10/2004 | Miyajima et al. ............. 355/72 |
| 2002/0000240 A1* | 1/2002 | Kamikawa ................ 134/57 R |
| 2002/0063856 A1* | 5/2002 | Inoue ......................... 355/53 |
| 2004/0233407 A1 | 11/2004 | Nishi et al. .................. 355/53 |

FOREIGN PATENT DOCUMENTS

| | | | |
|---|---|---|---|
| JP | 6-124873 | | 5/1994 |
| JP | 6-168866 | | 6/1994 |
| JP | 10-163099 | | 6/1998 |
| WO | WO 99/49504 | | 9/1999 |
| WO | WO99/49504 | * | 9/1999 |

* cited by examiner

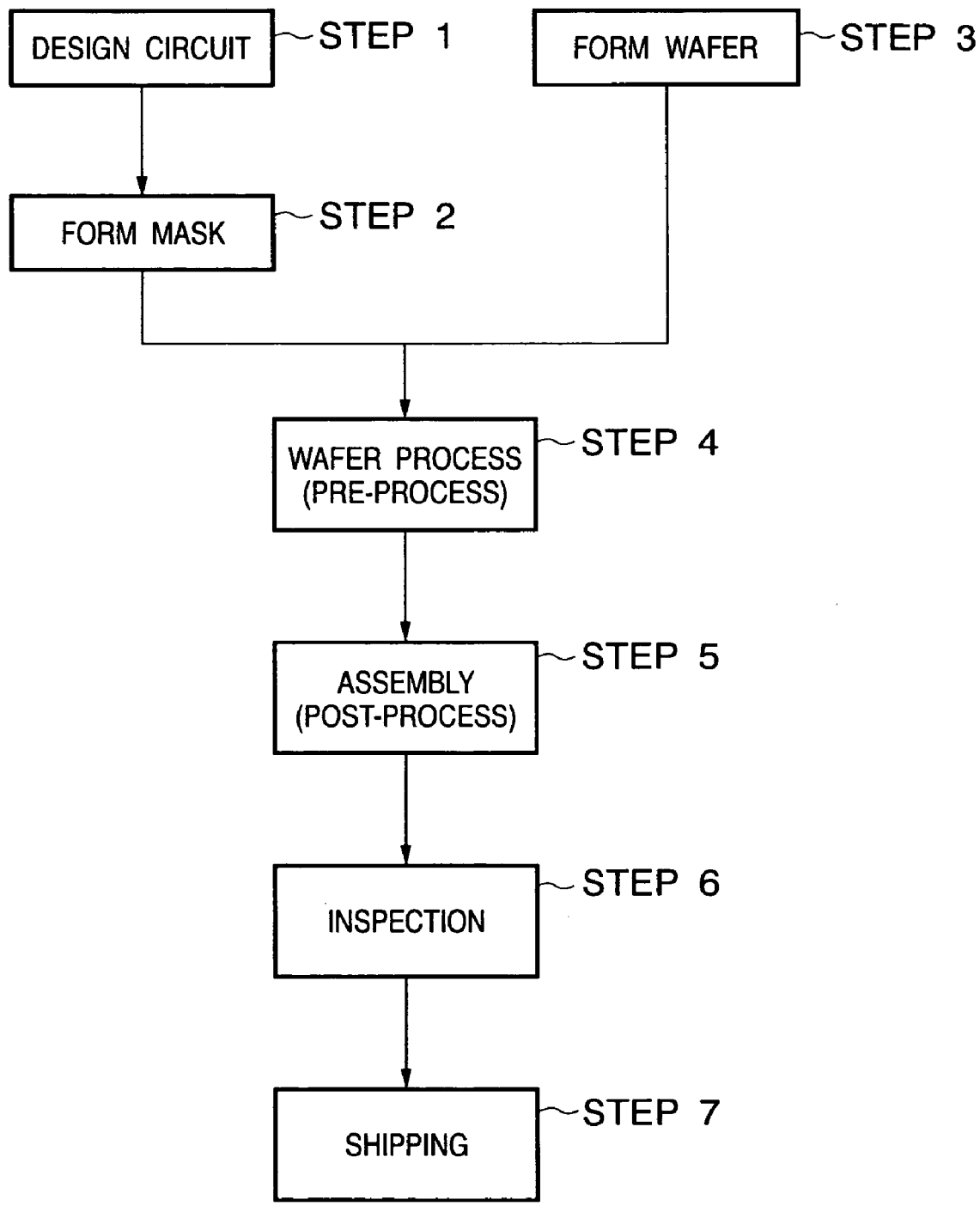

EXPOSURE METHOD AND APPARATUS HAVING A PROJECTION OPTICAL SYSTEM IN WHICH A PROJECTION GAP IS FILLED WITH LIQUID

FIELD OF THE INVENTION

The present invention relates to an exposure technique used in a device manufacturing process and, more particularly, to an exposure technique using an immersion method of immersing a substrate to be exposed in a liquid.

BACKGROUND OF THE INVENTION

A process of manufacturing a semiconductor device formed from the micropattern of an LSI, a VLSI, or the like, adopts a reduction projection exposure apparatus, which reduces a pattern formed on a mask, and projects and transfers it onto a substrate coated with a photosensitive agent. As the degree of integration of a semiconductor device increases, further micropatterning is required. The exposure apparatus has coped with micropatterning at the same time as the development of the resist process.

As a means for increasing the resolution of the exposure apparatus, there are a method of shortening the exposure wavelength and a method of increasing the numerical aperture of the projection optical system. In the latter case, there is proposed an immersion type exposure apparatus which implements a numerical aperture equal to the refractive index (1 or more) of a liquid by interposing a liquid layer between the final plane of the projection optical system and the surface of a substrate (e.g., wafer) to be exposed. As a conventional immersion type exposure apparatus, for example, Japanese Patent Laid-Open No. 6-124873 discloses an immersion type exposure apparatus comprising a wafer conveyance means and liquid bath. Japanese Patent Laid-Open No. 6-168866 discloses a system which sets a wafer in an immersion cassette and conveys the cassette.

FIG. 1 is a view showing the schematic structure of a conventional immersion type exposure apparatus. In FIG. 1, reference numeral 101 denotes an illumination system unit, which incorporates an exposure light source for emitting exposure light. Reference numeral 102 denotes a reticle stage, which supports a reticle serving as an exposure pattern master. Reference numeral 103 denotes a reduction projection lens, which reduces the exposure pattern of a master at a predetermined reduction exposure magnification ratio and projects the exposure pattern onto a substrate (wafer). Reference numeral 104 denotes an exposure apparatus main body, which supports the reticle stage 102, reduction projection lens 103, and the like.

Reference numeral 105 denotes an exposure stage which conveys a wafer chuck 105C which holds a wafer in the X and Y directions and positions the wafer chuck 105C on an exposure stage base 105B.

Reference numeral 106 denotes an alignment scope (microscope) which measures an alignment mark on the wafer and an alignment reference mark on the wafer chuck 105C, and measures alignment of the wafer held by the wafer chuck 105C. Reference numeral 107 denotes a focus scope which measures the planar shape of the wafer and the focus along the optical axis. After the end of alignment measurement and focus measurement, the exposure stage 105 moves to a predetermined immersion position on the exposure stage base 105B, and positions the wafer chuck 105C.

Reference numeral 113 denotes a wafer conveyance robot which supplies a wafer onto the wafer chuck 105C on the wafer stage 105 (wafer loading), and recovers the exposed wafer from the wafer chuck 105C (wafer unloading).

Reference numeral 114 denotes an immersion liquid tank which stores an immersion liquid. Before an exposure process, an immersion liquid drop recovery unit 115 drops the immersion liquid onto the wafer chuck 105C positioned by the exposure stage 105. After the exposure process, the immersion liquid drop recovery unit 115 recovers the immersion liquid from the wafer chuck 105C.

FIG. 2 is a flowchart for explaining the process flow of the exposure apparatus in FIG. 1. A wafer is loaded into an exposure area for performing exposure (S21), and then alignment measurement and focus measurement are executed (S22). After the end of measurement in step S22, the exposure stage 105 is moved and positioned at an immersion position at which the wafer chuck 105C on the stage receives the drops of a predetermined immersion liquid. Upon the completion of alignment, the immersion liquid drop recovery unit 115 drops the immersion liquid (S23).

Upon the completion of dropping the immersion liquid, the exposure stage 105 moves to an exposure position. Upon the completion of moving the exposure stage, the exposure apparatus starts an exposure process (S24).

After the end of the exposure process, the exposure stage 105 moves to a position for discharging the wafer in order to discharge (unload) the exposed wafer. Upon the completion of moving the exposure stage 105, the wafer conveyance robot 113 grips the wafer held on the wafer chuck 105C, and discharges (unloads) the wafer from the exposure area (S25). After the end of unloading (S25), the immersion liquid in the wafer chuck 105C is recovered by the immersion liquid drop recovery unit 115, and the wafer is dried (S26).

As described above, in the arrangement of the conventional immersion type exposure apparatus, a series of operations associated with the processes in steps S21 to S26 are serially performed. The time taken to process one wafer within the exposure area is the sum of processing times in steps S21 to S25, as shown in FIG. 3.

However, the conventional immersion type exposure apparatus serially executes a series of processes: wafer loading, alignment measurement/focus measurement, movement to an immersion position and dropping of an immersion liquid, an exposure process, wafer unloading, recovery of the immersion liquid, and a drying operation. The throughput (productivity) of the exposure apparatus is lower than that of a general exposure apparatus using no immersion method.

SUMMARY OF THE INVENTION

The present invention has been proposed in consideration of conventional problems, and has as its object to provide an immersion type exposure technique having higher productivity.

In order to achieve the above object, according to the present invention, there is provided an exposure apparatus comprising:

a first substrate stage which positions a substrate in a measurement area;

a measurement unit which measures the positioned substrate;

a second substrate stage which positions in an exposure area the substrate, measured by the measurement unit, based on the measurement result, while the substrate is immersed in a liquid;

an exposure unit which exposes the substrate positioned by the second substrate stage to a pattern; and a control unit which controls a parallel process of measurement by the first substrate stage and the measurement unit, and exposure by the second substrate stage and the exposure unit.

The present invention can provide an exposure technique having higher productivity.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 14 is a flowchart showing the flow of the whole manufacturing process of a semiconductor device.

DETAILED DESCRIPTION OF THE PREFERRED EMBODIMENT

A preferred embodiment of the present invention will now be described in detail in accordance with the accompanying drawings.

An exposure apparatus according to the present invention is useful for all exposure methods and exposure apparatuses which use, e.g., ultraviolet light as exposure light, and adopt an immersion method of interposing a liquid between the reduction projection lens and a substrate (e.g., a wafer). These exposure apparatuses include, e.g., an exposure apparatus, which projects and transfers a master pattern onto a substrate while the substrate stands still, and an exposure apparatus, which exposes a substrate to a master pattern with slit light while synchronously scanning the substrate and master.

Figure 4A:
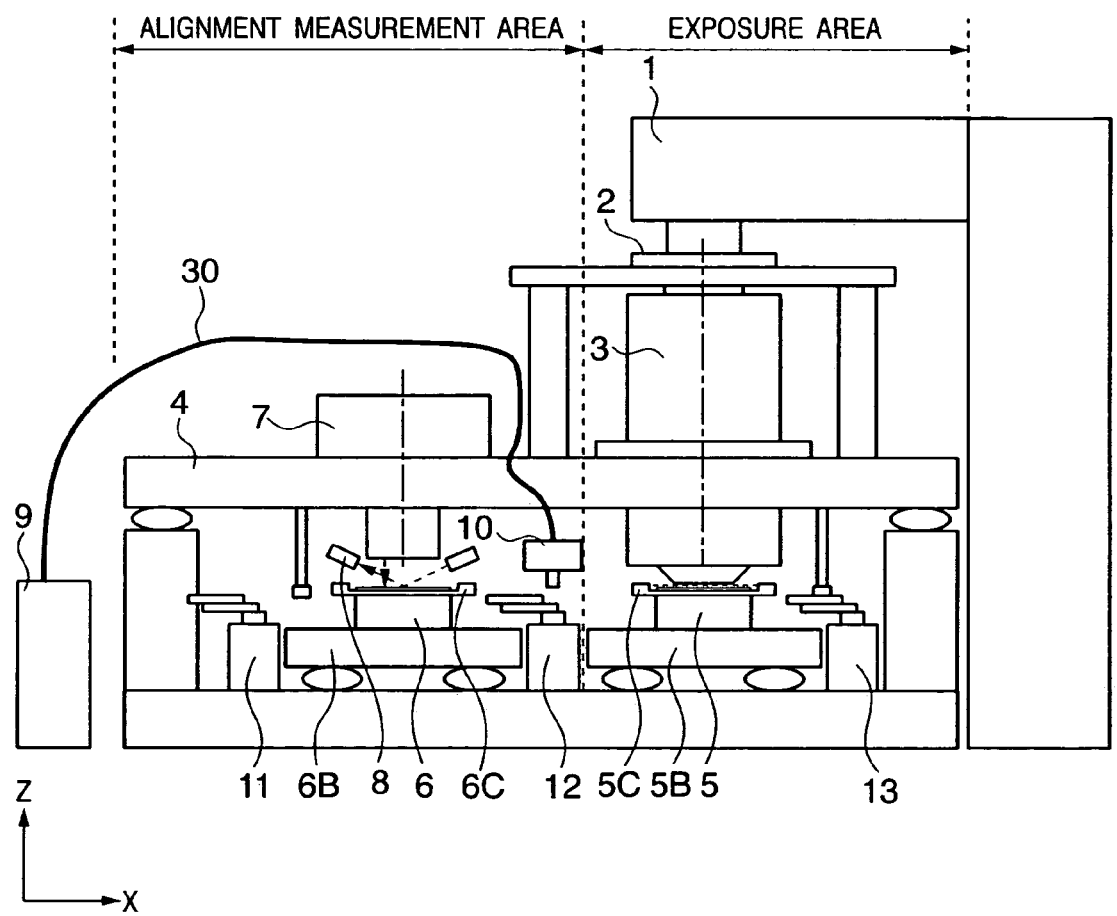
FIG. 4A is a view schematically showing the arrangement of a preferred embodiment of the present invention.
Figure 4B:
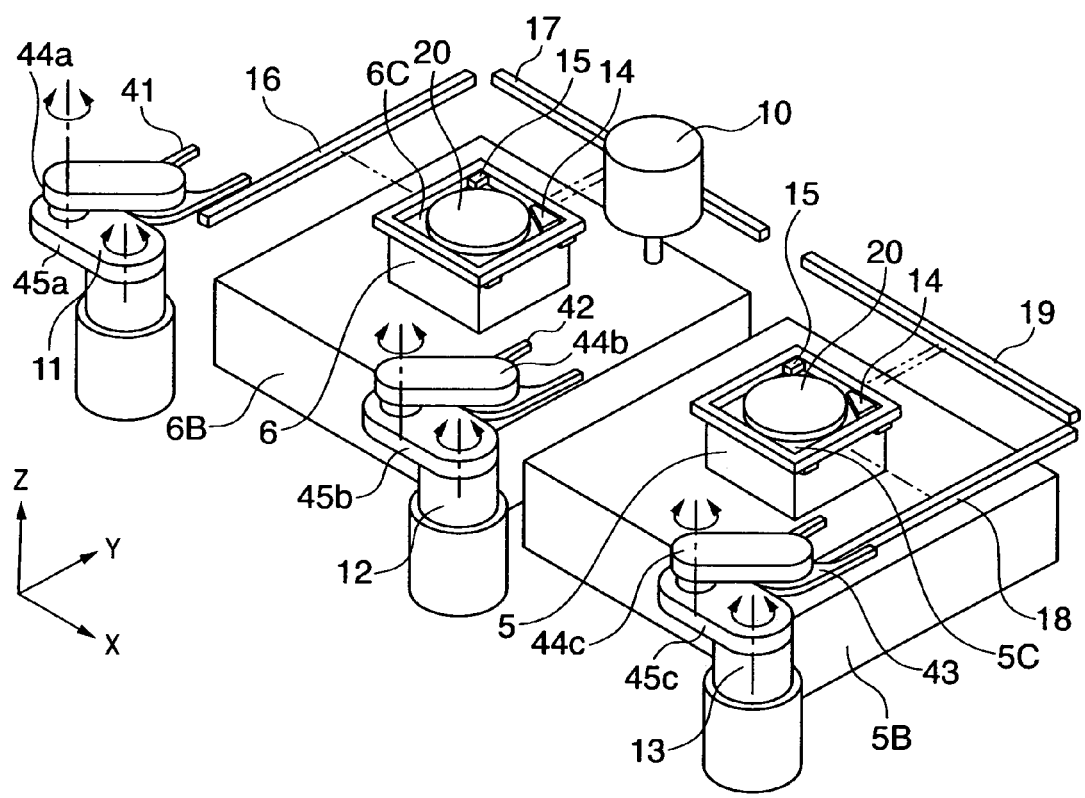
FIG. 4B is a perspective view showing the arrangements of a conveyance robot and a stage, which perform loading of a substrate, alignment measurement, dropping of an immersion liquid, conveyance from an alignment measurement area to an exposure area, exposure, and unloading of an exposed wafer.
Figure 4C:
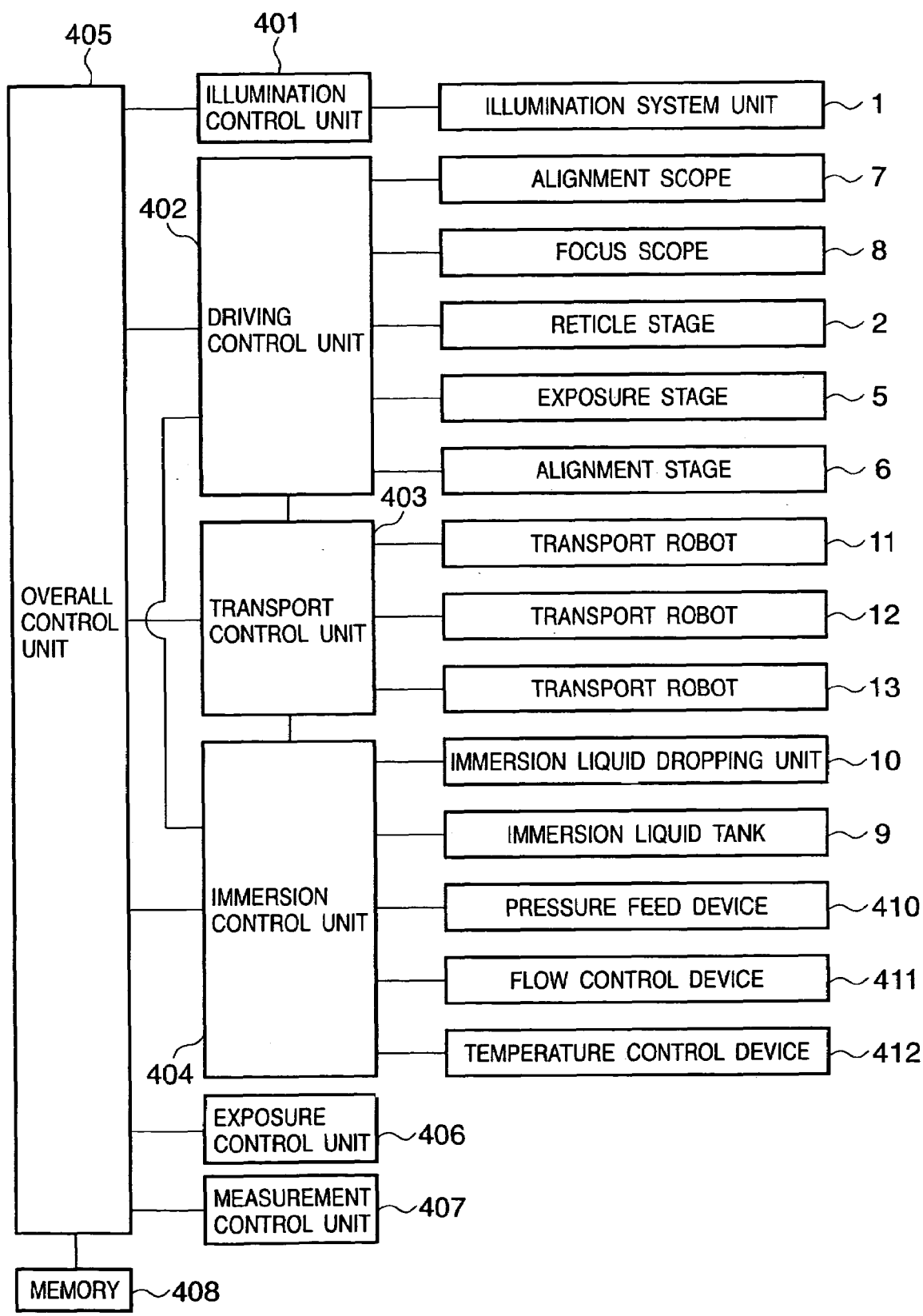
FIG. 4C is a control block diagram for controlling the mechanism.

A preferred embodiment of the present invention will be illustratively described. FIG. 4A is a view schematically showing the arrangement of the preferred embodiment of the present invention. FIG. 4B is a perspective view showing the arrangements of a conveyance robot and stage, which perform loading of a substrate (e.g., a wafer), alignment measurement, dropping of an immersion liquid, conveyance from an alignment measurement area to an exposure area, exposure, and unloading of an exposed wafer. FIG. 4C is a control block diagram for controlling the mechanism.

Overall Structure of Exposure Apparatus

In FIG. 4A, the exposure apparatus has an exposure area where an exposure process is done, and an alignment measurement area where alignment measurement, dropping of an immersion liquid, and the like, are done. An exposure stage 5 and alignment stage 6, which support a wafer to be processed and position it to predetermined positions can be driven in the respective areas to parallel-execute processes in the respective areas.

Focus measurement and alignment measurement in the alignment measurement area are executed as processes in air without any immersion liquid. The immersion liquid is dropped in conveying the wafer chuck from the alignment measurement area to the exposure area. The wafer chuck filled with the immersion liquid is conveyed to the exposure area. In the exposure area, an exposure process in which the immersion liquid is interposed between a wafer on the wafer chuck and the projection optical system is executed. By parallel-executing the process in the alignment measurement area and the process in the exposure area, immersion type exposure having a high throughput can be implemented.

The arrangement of the immersion type exposure apparatus will be explained with reference to the accompanying drawings. Reference numeral 1 denotes an illumination system unit, which incorporates an exposure light source for emitting exposure light. The illumination system unit has a function of masking and shaping exposure light and irradiating a reticle with shaped exposure light so as not to illuminate a master (to be referred to as a "reticle" hereinafter), except the exposure pattern area with light emitted from the exposure light source. An illumination control unit 401 (FIG. 4C) controls the exposure light source, and controls irradiation of exposure light at a predetermined timing.

Reference numeral 2 denotes a reticle stage which supports a reticle serving as an exposure pattern master. Reference numeral 3 denotes a reduction projection lens which reduces the exposure pattern of a master at a predetermined reduction exposure magnification ratio and projects the exposure pattern onto a substrate (e.g., wafer). Reference numeral 4 denotes an exposure apparatus main body which supports the reticle stage 2, reduction projection lens 3, and the like.

Mechanism and Control of Stage

The exposure stage 5 positions a wafer at a predetermined exposure position in the exposure area. The alignment stage 6 positions the wafer at a predetermined measurement position in order to measure the position of the wafer held by a wafer chuck 6C in the alignment measurement area. The two-dimensional positions of the exposure stage 5 and alignment stage 6 within the X-Y plane are measured in real time by X bar mirrors (18 and 16: FIG. 4B), Y bar mirrors (19 and 17: FIG. 4B), and a laser interferometer (not shown). A driving control unit 402 (FIG. 4C) performs alignment control of the exposure stage 5 and alignment stage 6 on the basis of the measurement values. The position of the reticle stage 2 is also similarly measured. The driving control unit 402 positions the reticle stage 2 on the basis of the measurement result, and controls the reticle stage 2 and exposure stage 5.

The driving control unit 402 (FIG. 4C) can control driving of a single stage, and also synchronously drive and control stages. The driving control unit 402 communicates with a conveyance control unit 403, and performs control of implementing stage driving synchronized with chuck conveyance robots (11, 12, and 13).

For example, when a wafer held by the wafer chuck is to be loaded to the alignment measurement area, the driving control unit 402 positions and controls the alignment stage 6 in order to synchronize the chuck conveyance robot 11 and alignment stage 6, position the alignment stage 6 at a predetermined loading position, and receive the newly loaded wafer chuck 6C from the chuck conveyance robot 11. The conveyance control unit 403 controls the chuck conveyance robot 11 in order to set the wafer chuck 6C on the positioned/controlled alignment stage 6.

When the wafer chuck 6C is to be conveyed from the alignment measurement area to the exposure area, the driving control unit 402 communicates with the conveyance control unit 403, and executes alignment control of the alignment stage 6 and exposure stage 5 in synchronism with movement of the chuck conveyance robot 12. The alignment stage 6 is positioned at a predetermined position, and the wafer chuck is transferred to the chuck conveyance robot 12. The chuck conveyance robot 12 conveys the wafer chuck, and sets it on the exposure stage 5 within the exposure area.

When the wafer chuck is to be conveyed from the alignment measurement area to the exposure area, the conveyance control unit 403, which controls the chuck conveyance robot 12 and an immersion control unit 404, which controls dropping of an immersion liquid, communicate with each other. The control units (403 and 404) execute control of synchronously performing movement of the chuck conveyance robot and operation of dropping the immersion liquid.

Process in Alignment Measurement Area

Alignment of a wafer 20, which is positioned at a predetermined measurement position and held on the alignment stage 6 within the alignment measurement area, is measured by an alignment scope 7 (e.g., a microscope) using a reference mark 14 formed on the wafer chuck 6C. Reference numeral 8 denotes a focus scope, which performs measurement for the planar shape of the wafer 20 held on the wafer chuck 6C and the focal depth along the optical axis (Z direction). A measurement control unit 407 controls a measurement process in the alignment measurement area, and measurement results are provided to an overall control unit 405 and stored in a memory 408.

The exposure stage 5 and alignment stage 6 incorporate driving devices for adjusting the position of the wafer 20 within the plane (X and Y directions) and the angle of the wafer 20 in the vertical direction (Z direction). The driving control unit 402 controls the exposure stage 5 in the exposure area by referring to measurement results stored in the memory, and adjusts the position of the exposure stage 5 within the plane (X-Y plane) and the angle of the exposure stage 5 in the direction of height (Z direction) so that the exposure region of the wafer 20 always coincides with the focal plane of exposure light at high precision.

Mechanism and Control of Immersion Liquid

Reference numeral 9 denotes an immersion liquid tank, which stores an immersion liquid. The tank includes a pressure feed device 410, which feeds the immersion liquid, a flow control device 411, which controls the supply flow rate of the liquid, and a temperature control device 412, which controls the temperature of the stored immersion liquid. These devices are controlled by the immersion control unit 404 (FIG. 4C). A preferable example of the immersion liquid is a liquid, which hardly absorbs exposure light in order to ensure a predetermined irradiation amount to a wafer to be exposed. A more preferable example is a liquid, which has been deaerated in advance so as not to generate any bubble in the liquid by dropping of the immersion liquid. The exposure light preferably exhibits a quick drying property so as to be able to complete drying within a short time after the end of the exposure process.

In FIG. 4A, reference numeral 10 denotes an immersion liquid dropping unit which can supply the immersion liquid from the immersion liquid tank 9 to the wafer chuck via a carrier pipe 30. The start of dropping the immersion liquid in the immersion liquid tank 9, and the dropping flow rate are controlled by the pressure feed device 410 and flow control device 411 under the control of the immersion control unit 404. The immersion control unit 404 communicates with the conveyance control unit 403, and controls the start of dropping and the dropping flow rate in synchronism with conveyance operation by the chuck conveyance robot 12.

The conveyance control unit 403 generates the track of the chuck conveyance robot 12 immediately below the immersion liquid dropping unit 10, and performs alignment control for filling the immersion liquid dropped from the immersion liquid dropping unit 10 in the wafer chuck. The conveyance control unit 403 controls the chuck conveyance robot 13 in order to receive from the exposure stage 5 the wafer chuck having completely undergone a predetermined exposure process within the exposure area and conveys the wafer chuck to an immersion liquid recovery/drying chamber 301 (see FIG. 4E).

At this time, the driving control unit 402, which controls the exposure stage 5 and the conveyance control unit 403, which controls the chuck conveyance robot 13, communicate with each other, and control to synchronously execute alignment of the stage 5 and driving of the conveyance robot 13.

Wafer Chuck

Figure 4D:
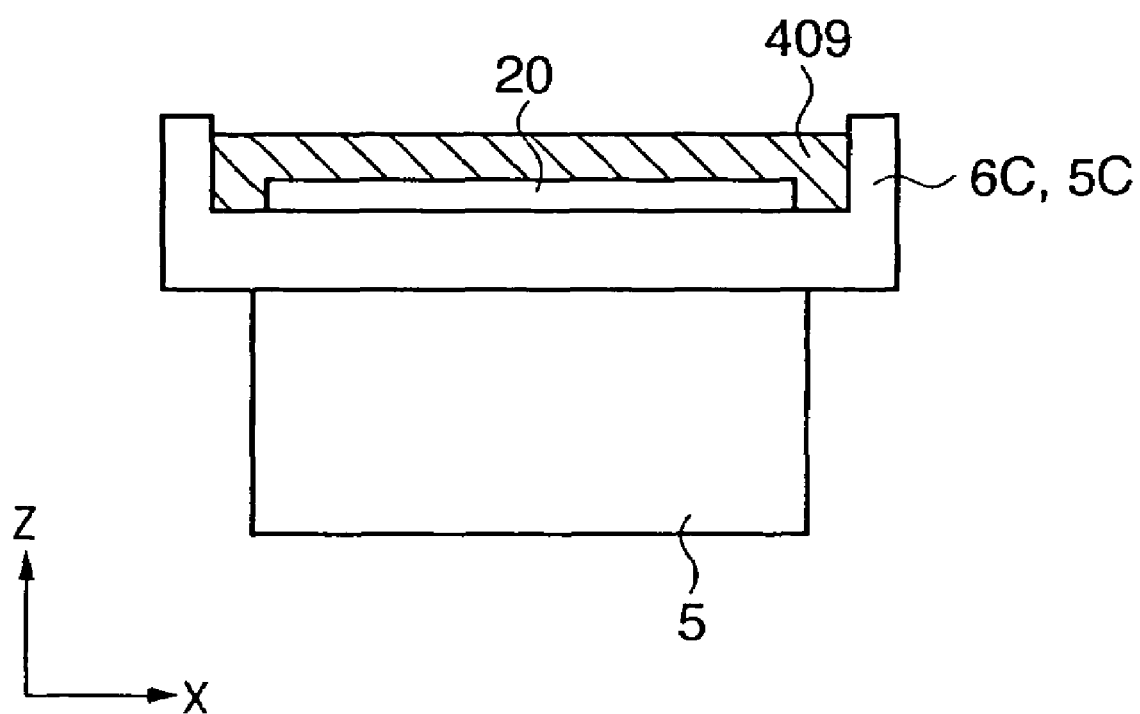
FIG. 4D is a sectional view schematically showing the sectional shape of a wafer chuck 6C (5C)

FIG. 4D is a sectional view schematically showing the sectional shape of the wafer chuck 6C (5C), and the XZ section has a recessed shape. The wafer chuck 6C (5C) can hold a wafer to be exposed while the wafer 20 is held on a substrate holding member 408 and immersed in a dropped immersion liquid 409.

Conveyance of Wafer Chuck

The chuck conveyance robots for conveying a wafer in the alignment measurement area and exposure area will be explained. In FIG. 4B, the chuck conveyance robot 11 supplies the wafer chuck 6C supporting the wafer 20 to the alignment stage 6 within the alignment measurement area (see FIG. 4A). The chuck conveyance robot 12 is positioned between the alignment measurement area and the exposure area (see FIG. 4A). The chuck conveyance robot 12 can discharge the wafer chuck 6C having undergone alignment measurement from the alignment measurement area, and supply the wafer chuck filled with the immersion liquid to the exposure stage 5 within the exposure area via the conveyance path. The wafer chuck 5C in FIG. 4B is the wafer chuck supplied by the chuck conveyance robot 12.

In conveyance from the alignment measurement area to the exposure area, the chuck conveyance robot 12 positions the wafer chuck 6C immediately below the immersion liquid dropping unit 10. The immersion control unit 404 starts dropping the immersion liquid upon the completion of alignment. After the end of dropping the immersion liquid, the conveyance control unit 403 drives the chuck conveyance robot 12 again to supply the wafer chuck filled with the immersion liquid to the exposure stage 5.

The chuck conveyance robot 13 conveys the wafer chuck 5C which holds an exposed wafer from the exposure area to the immersion liquid recovery/drying chamber 301. The chuck conveyance robots (11, 12, and 13) are formed from link mechanisms (44a, 45a, 44b, 45b, 44c, and 45c). By controlling the turn of the links, chuck gripping mechanisms (41, 42, and 43) can be moved in the translation direction. The chuck conveyance robots (11, 12, and 13) comprise vertical driving mechanisms (not shown). The vertical driving mechanisms can move up and down the chuck gripping mechanisms (41, 42, and 43) in the Z direction, and position them so as to grip the wafer chucks (5C and 6C) on the stages (5 and 6).

Exposure Process

When the wafer chuck 6C (to be referred to as the "wafer chuck 5C" in the exposure area) is set on the exposure stage 5 within the exposure area, an illuminance sensor 15 provided to the wafer chuck 5C calibrates the illuminance of exposure light before exposure, and exposure light corrected by calibration is emitted (1 and 401). While the reticle (master) is illuminated with exposure light, the reticle stage (master stage) 2, which holds the reticle and the exposure stage 5, which holds the wafer (substrate) 20, operate in synchronism with each other. The entire exposure pattern on the reticle is formed on the wafer 20 through synchronization, and the resist applied onto the surface of the wafer 20 is exposed to light.

An exposure control unit 406 (FIG. 4C) controls an exposure process in accordance with set exposure conditions such as the wafer size and exposure condition (irradiation amount of exposure light).

Figure 4E:
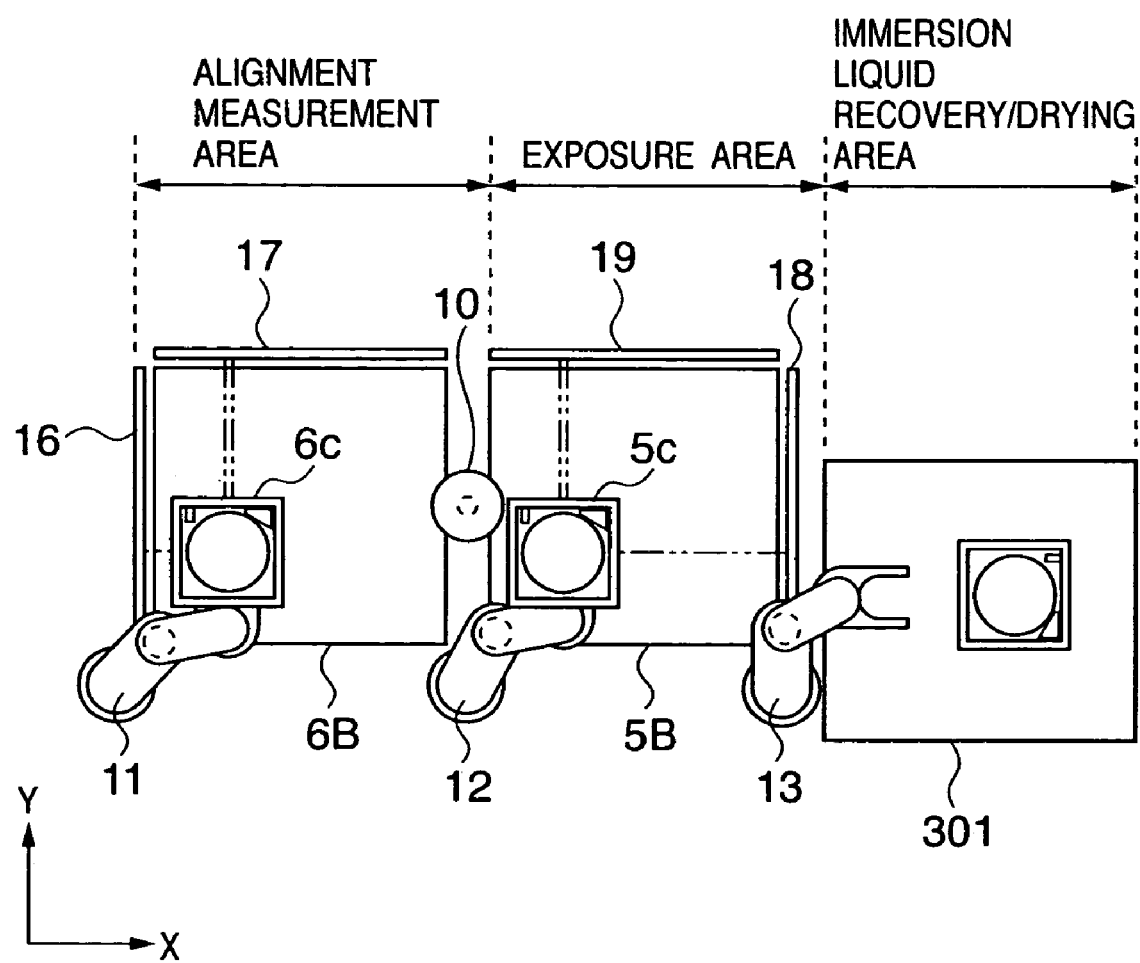
FIG. 4E is a plan view showing the alignment measurement area, exposure area, and immersion liquid recovery/drying area.

The exposure stage 5 having undergone the exposure process moves to a predetermined position on an exposure stage base 5B under the control of the driving control unit 402. Upon the completion of positioning the exposure stage 5, the chuck conveyance robot 13 grips the wafer chuck 5C, discharges it from the exposure area, and conveys it to the immersion liquid recovery/drying chamber 301 (FIG. 4E).

In the above description, attention is paid to each mechanism which forms the exposure apparatus. The operation flow in the alignment measurement area and exposure area will be explained with reference to FIGS. 5A to 5G, 6A to 6D, and 7.

Operation Sequence

FIGS. 5A to 5G are views showing the operation relationship within the X-Y plane between the chuck conveyance robots (11, 12, and 13) in the alignment measurement area and exposure area shown in FIG. 4A, an alignment stage base 6B, the alignment stage 6, the exposure stage base 5B, the exposure stage 5, and the immersion liquid dropping unit 10.

Figure 5A:
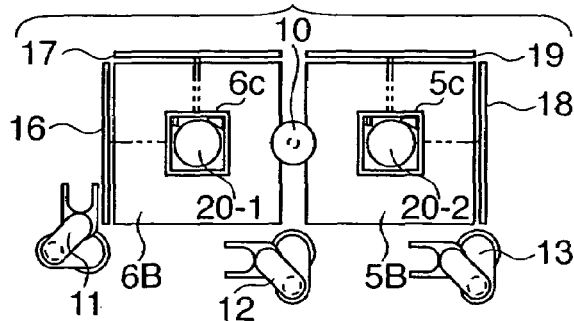
FIGS. 5A to 5G are views showing the operation relationship within the X-Y plane between chuck conveyance robots in the alignment measurement area and exposure area shown in FIG. 4A, an alignment stage base 6B, an alignment stage 6, an exposure stage base 5B, an exposure stage 5, and an immersion liquid dropping unit 10.

FIG. 5A shows a state in which the chuck conveyance robot 11 sets the wafer chuck 6C on the alignment stage 6, and the chuck conveyance robot 12 sets the wafer chuck 5C on the exposure stage 5. The stages can start parallel movement from their home positions for the purpose of alignment measurement and an exposure process. During alignment measurement in one area, the exposure process can be done in the other exposure area. The processing time can be shortened by parallel execution of the two processes.

Figure 5C:
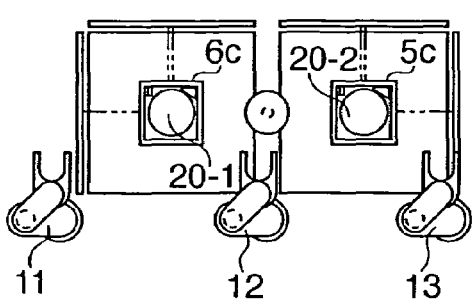
Figure 5B:
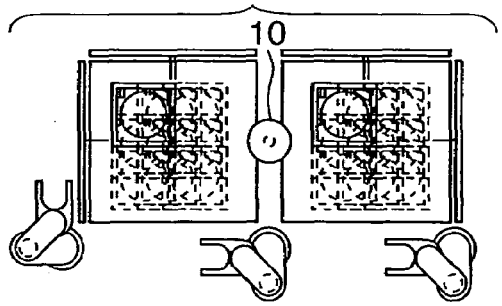

In FIG. 5B, alignment measurement and focus measurement are performed for a wafer 20-1 conveyed to the alignment stage 6. For this purpose, the driving control unit 402 controls the alignment stage 6 to position the alignment stage 6 at a predetermined measurement position. The alignment scope 7 and focus scope 8 perform alignment measurement and focus measurement. If the immersion liquid exists in alignment measurement and focus measurement, it becomes difficult to measure and detect the focus because of a small refractive index difference between the resist and the immersion liquid and a small reflectance difference between the immersion liquid surface and the resist surface. Thus, in the alignment measurement area, alignment measurement and focus measurement are performed without dropping any immersion liquid.

In the exposure area, the wafer chuck 5C, which has undergone alignment measurement and is filled with the immersion liquid, is set on the exposure stage 5. The stage sequentially moves to predetermined exposure positions, the entire exposure pattern on the reticle is formed onto the wafer, and an exposure process of exposing the resist applied onto the wafer surface to light is executed. Alignment measurement and the exposure process in FIG. 5B can be parallel-executed. In order to execute the parallel processes, the control units (401 to 404) and overall control unit 405 control the moving timings of the chuck conveyance robots (11, 12, and 13), alignment stage 6, exposure stage 5, and immersion liquid dropping unit 10, and control the mechanisms (5, 6, 10, 11, 12, 13, and the like), so the wafer to be processed does not stay in each area and the process in each area does not delay a process in the next step.

FIG. 5C shows a state in which alignment measurement and the exposure process end. The driving control unit 402 moves the alignment stage 6 and exposure stage 5 to predetermined positions so as to recover the processed wafer chucks (6C and 5C) by the chuck conveyance robots 12 and 13, respectively.

Figure 5D:
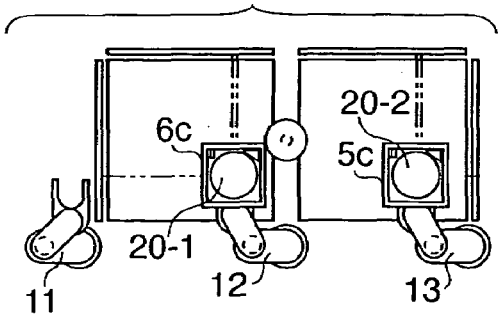

FIG. 5D shows a state in which the chuck conveyance robots 12 and 13 grip the wafer chucks 6C and 5C having undergone the measurement process and exposure process in the respective areas. The chuck conveyance robot 12 conveys the wafer chuck 6C from this state to a position immediately below the immersion liquid dropping unit 10. The chuck conveyance robot 13 conveys the wafer chuck 5C from the exposure area in the exposure apparatus to the chamber 301 in the immersion liquid recovery/drying area.

At this time, the chuck conveyance robot 11 grips a wafer chuck 6e, which supports a new wafer 20-3. The conveyance control unit 403 can communicate with the remaining control units (401, 402, 404, and 405), and perform loading/unloading of wafers (20-1, 20-2, and 20-3) in synchronism with the driving mechanisms (5 and 6), immersion liquid dropping unit (10), and exposure processing units (1, 3, and 401).

Immersion Liquid Dropping Process

Figure 5E:
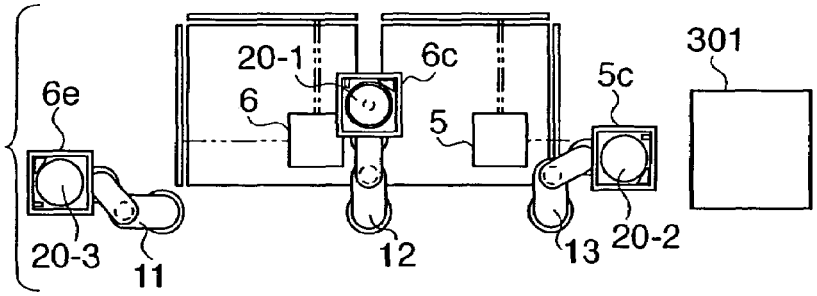
Figure 5F:
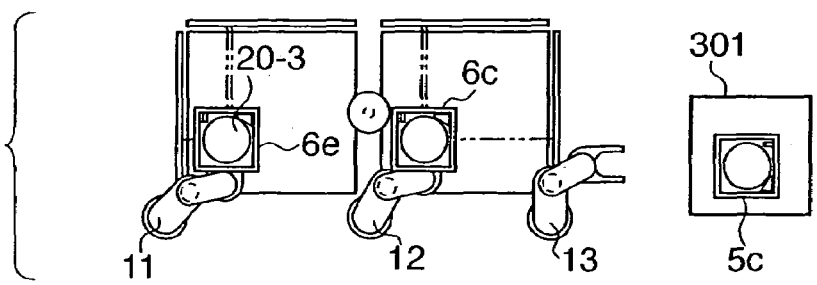

Dropping of an immersion liquid to the wafer chuck 6C in the state of FIG. 5E will be explained with reference to FIGS. 6A to 6D.

Figure 6A:
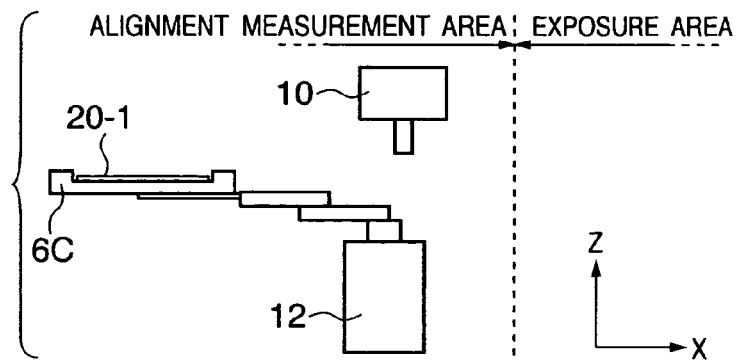
FIGS. 6A to 6D are views for explaining an immersion liquid dropping process.
Figure 6B:
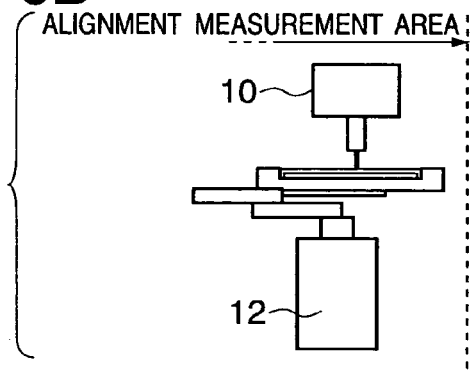

FIG. 6A shows a state in which the chuck conveyance robot 12 grips the wafer chuck 6C in the alignment measurement area. FIG. 6B shows a state in which the immersion liquid is dropped onto the wafer chuck 6C moved immediately below the immersion liquid dropping unit 10. The immersion control unit 404 and the conveyance control unit 403, which controls alignment of the chuck conveyance robot 12, can communicate with each other and execute synchronized control operations. The immersion liquid is pressure-fed (410 and 411) at a predetermined flow rate upon the completion of alignment by the chuck conveyance robot 12, and dropped from the immersion liquid dropping unit 10 onto the wafer chuck 6C via the carrier pipe 30. The immersion liquid having a refractive index of one or more is dropped to a predetermined depth on the upper surface of the wafer 20-1.

Figure 6C:
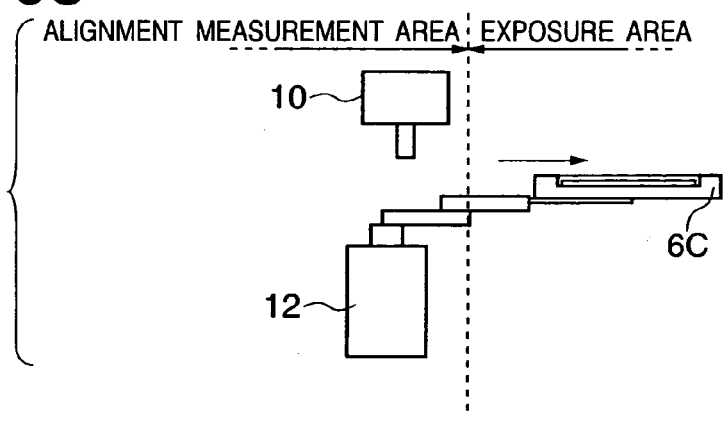

As shown in FIG. 6C, the wafer chuck 6C filled with the immersion liquid is conveyed into the exposure area by the chuck conveyance robot 12, and set on the exposure stage 5.

Figure 6D:
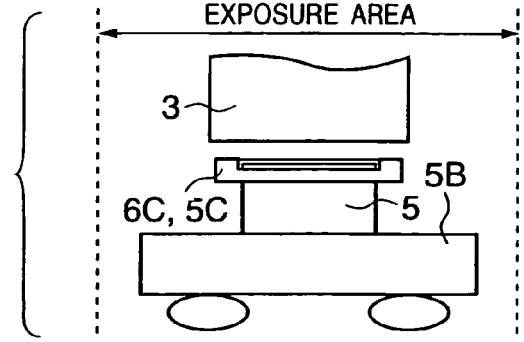

The Z level of the wafer chuck 6C (corresponding to 5C in FIG. 4A) set on the exposure stage 5 is controlled by alignment of the exposure stage 5. As shown in FIG. 6D, the immersion liquid is filled between the final plane of the reduction projection lens 3 and the wafer 20-1 to be exposed on the wafer chuck 6C (5C). Even when light sources having the same wavelength are used on the assumption that the maximum incident angle of a light ray, which forms an image on a wafer, is equal between a method using immersion and a method using no immersion, the resolution of the exposure method using immersion increases by the refractive index (n>1) of the immersion liquid in comparison with the (conventional) method using no immersion. This is equal to setting the numerical aperture (NA) of a conventional projection optical system to the refractive index n. Immersion type exposure can obtain a resolution of NA>1 or more, which cannot be achieved by the conventional method.

Referring back to FIG. 5F, the wafer chuck 5C having undergone the exposure process is conveyed from the exposure stage 5 to the immersion liquid recovery/drying chamber 301 by the chuck conveyance robot 13. The wafer chuck 6C filled with the immersion liquid is set for the next wafer exposure on the exposure stage 5 by the chuck conveyance robot 12. The wafer chuck 6e supporting the new wafer 20-3 is set for the next alignment measurement on the alignment stage 6 by the chuck conveyance robot 11.

Figure 5G:
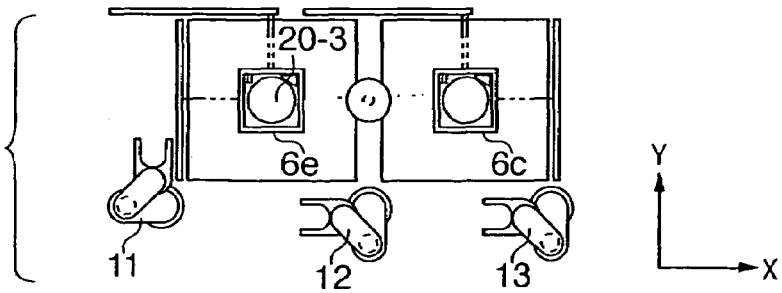

In FIG. 5G, the wafer chuck 6C filled with the immersion liquid is set on the exposure stage 5. The driving control unit 402 controls the exposure stage 5, and controls its movement and alignment for the purpose of an exposure process in the exposure area. When the wafer chuck 6e is newly set on the alignment stage 6, the driving control unit 402 controls the alignment stage 6, and controls its movement and alignment for the purpose of a measurement process in the alignment measurement area.

Figure 1:
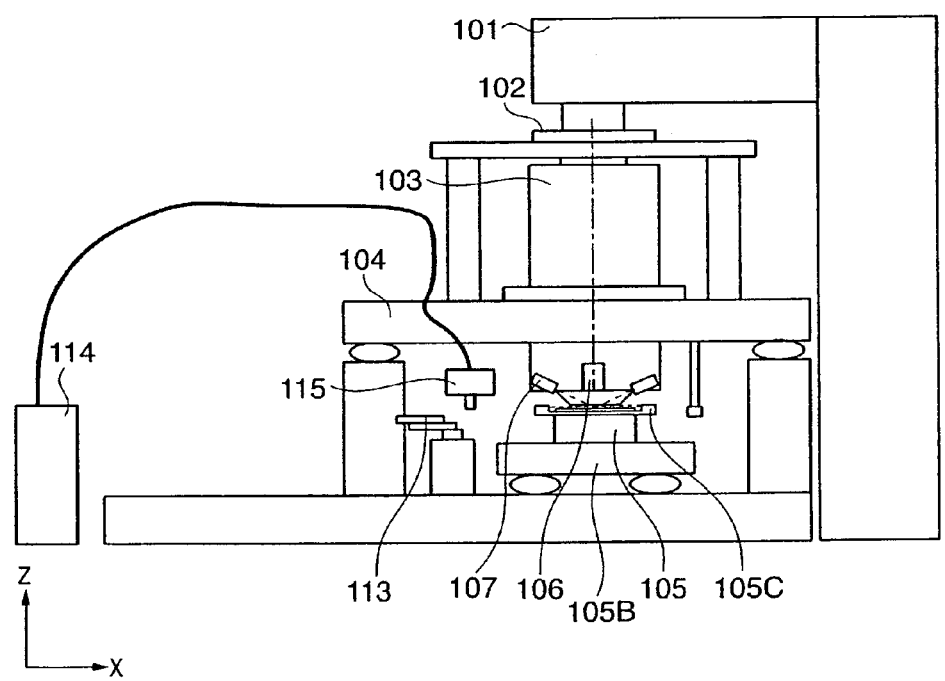
FIG. 1 is a view showing the schematic structure of a conventional immersion type exposure apparatus.
Figure 2:
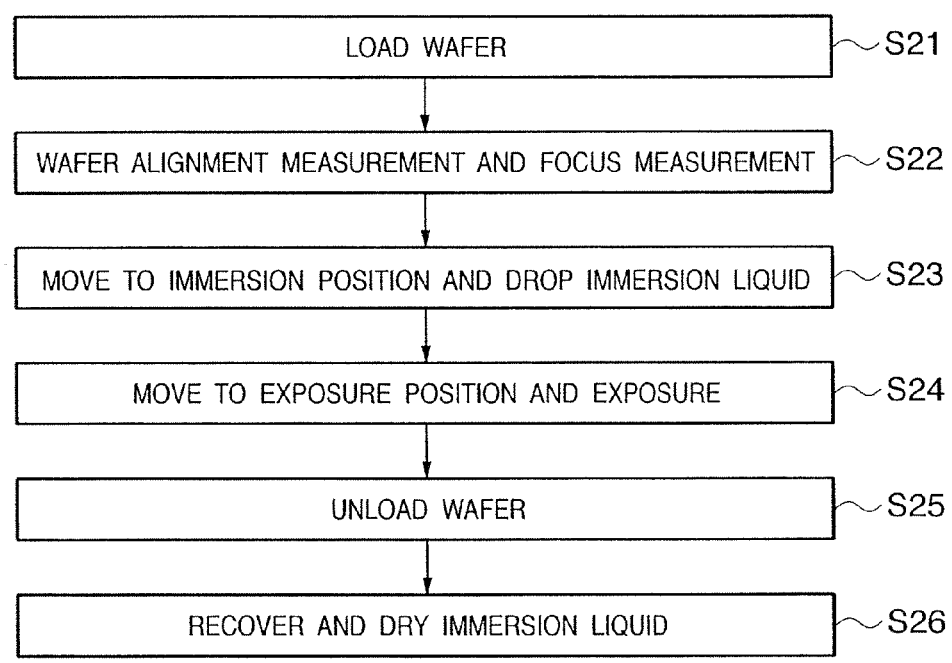
FIG. 2 is a flowchart for explaining the process flow of the exposure apparatus in FIG. 1.
Figure 3:
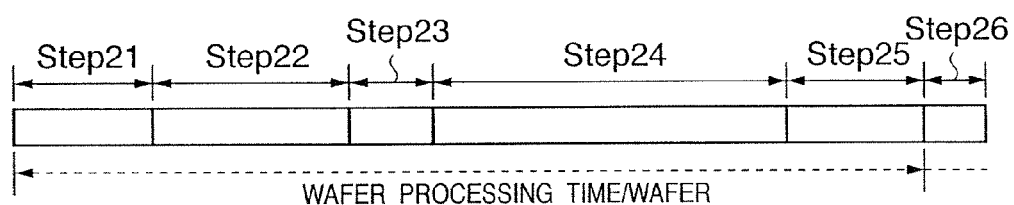
FIG. 3 is a view showing the time taken to process one wafer within the exposure area of the exposure apparatus in FIG. 1.

The process flow in parallel-executing alignment measurement and an exposure process has been described. A flowchart and a timing chart which pay attention to processes for one wafer are shown in FIGS. 7 and 8 in order to compare the series of process operations with those of the prior art (FIGS. 2 and 3).

Figure 7:
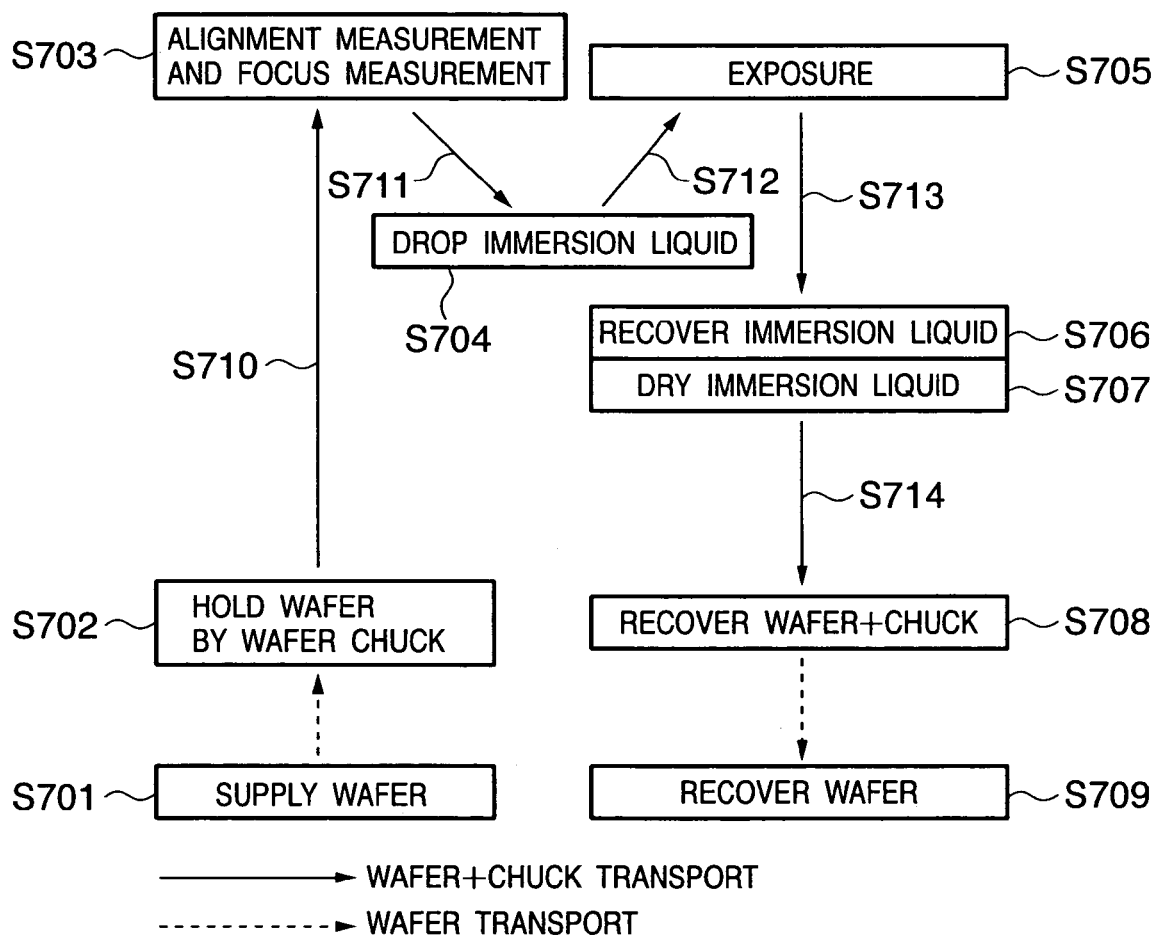
FIG. 7 is a flowchart showing an operation flow of performing exposure by immersion according to the embodiment.

FIG. 7 is a flowchart showing an operation flow of performing exposure by immersion according to the embodiment. FIG. 8 is a timing chart showing the distribution of processing times taken for respective steps in the flowchart of FIG. 7 when attention is paid to processes for one wafer.

The exposure apparatus according to the embodiment can shorten the time taken for processes by parallel-executing in two areas a process (S703) associated with alignment measurement/focus measurement and a process (S704) associated with exposure, as shown in FIG. 7. In order to parallel-execute these two processes, conveyance of the wafer and wafer chuck subjected to a process must be synchronized between steps (S710, S711, S712, S713 and S714). A conveyance mechanism coping with the parallel processes and control of the mechanism are indispensable. The embodiment employs the exposure stage 5, the alignment stage 6, the chuck conveyance robots (11, 12, and 13), the immersion liquid dropping unit 10, and the control units (402, 403, and 404), which synchronize the operations of these units. With this arrangement, a supplied wafer (S701) is held by the wafer chuck (6C) (S702), and alignment measurement and focus measurement are done (S703). The immersion liquid is dropped (S704), and an exposure process (S705) is performed. The wafer chuck 5C, which holds the exposed wafer 20, is conveyed to the immersion liquid recovery/drying chamber 301 to recover the immersion liquid (S706) and dry it (S707). After that, the wafer, and the like, are recovered (S708 and S709).

Figure 8:
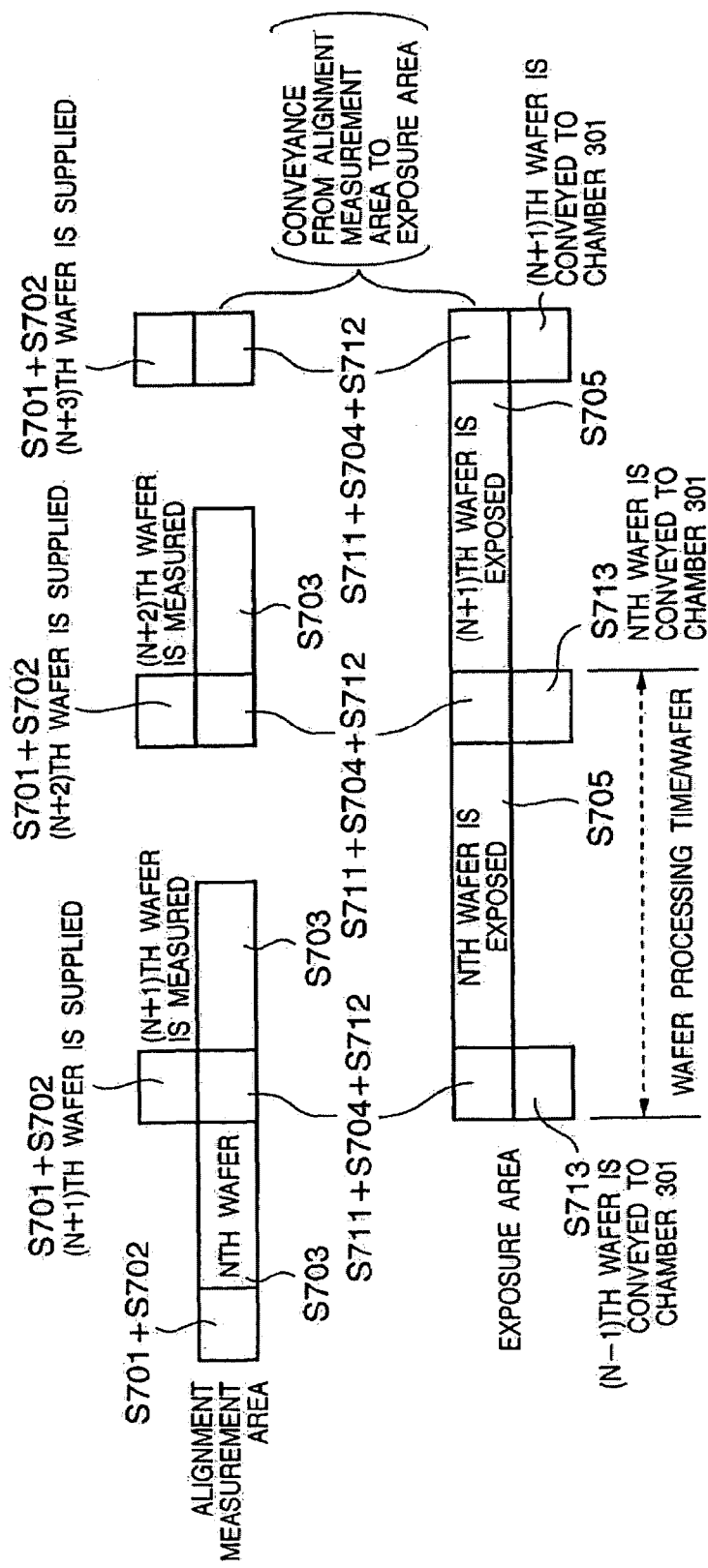
FIG. 8 is a timing chart showing the distribution of processing times taken for respective steps in the flowchart of FIG. 7 when attention is paid to processes for one wafer.

In the timing chart of FIG. 8, the process (S701 and S702: see FIG. 7 for step numbers) of supplying the (N+1)th unprocessed wafer to the alignment measurement area, the process (S711, S704, and S712) of conveying the Nth wafer having undergone the measurement process from the alignment measurement area to the exposure area, and the process (S713) of conveying the (N−1)th exposed wafer from the exposure area to the immersion liquid recovery/drying chamber 301 are parallel-executed by synchronized conveyance control.

By synchronizing the conveyance timings, a decrease in throughput by the standby time for the next step can be prevented.

In the timing chart of FIG. 8, the measurement process for the (N+1)th wafer must be completed within the time during which the Nth wafer is exposed. This is because a process delay in the measurement process step acts as a constraint condition to prevent a decrease in throughput of the exposure process step.

Figure 9A:
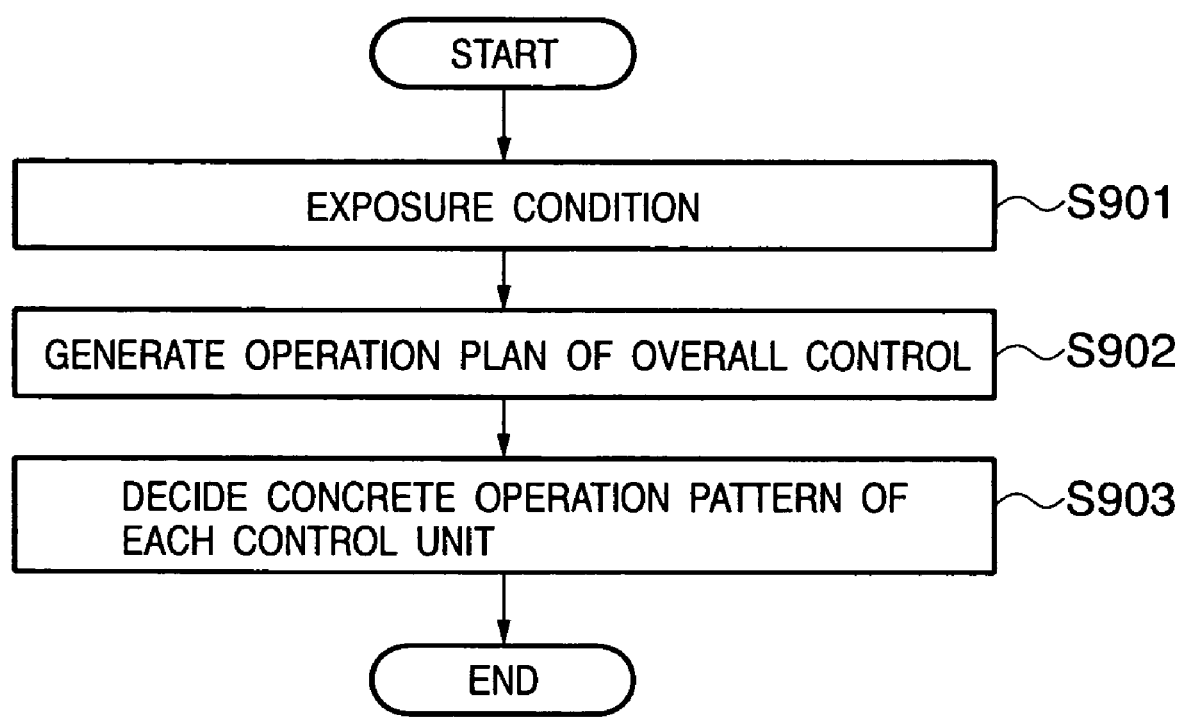
FIG. 9A is a flowchart for explaining a process of deciding an operation plan and an operation pattern for controlling the exposure apparatus.

For this purpose, the overall apparatus control unit 405 generates a plan for comprehensively controlling the operations of the control units (401 to 404, 406, and 407) in accordance with a flowchart as shown in FIG. 9A. The control units execute concrete control operations so as to satisfy the plan. For example, exposure conditions, such as the wafer size and exposure time (irradiation amount of exposure light), are set in step S901. The overall control unit 405 generates an operation plan (e.g., process A is completed within time T1, and process B is completed within time T2) requested of the control units (401 to 404, 406, and 407) shown in FIG. 4C (S902). Upon reception of this plan, the control units (401 to 404, 406, and 407) concretely decide conditions for executing concrete control operations (e.g., an acceleration/deceleration pattern for driving the stage and a settling condition for positioning the stage in order to complete process A within time T1) in accordance with the operation plan generated in steps S902 an S903.

Figure 9B:
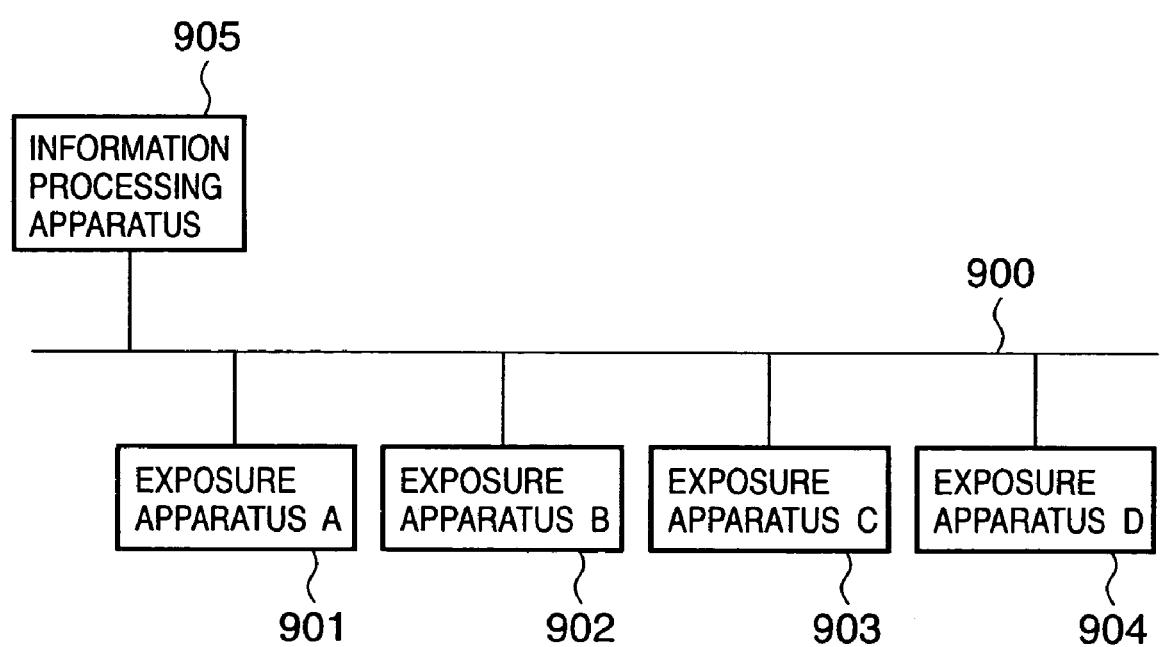
FIG. 9B is a block diagram for explaining the arrangement of an exposure apparatus connected to a network.

In the process of FIG. 9A, as shown in FIG. 9B, an information processing apparatus 905 and the overall control unit 405 can communicate with each other via a network 900, and receive and set as data the operation plan of the exposure apparatus and the concrete operation patterns of the control units. In a production line comprised of a plurality of exposure apparatuses (901 to 904), the information processing apparatus 905 may transmit as data the operation plans of the exposure apparatuses and the concrete operation patterns of the control units in the exposure apparatuses, and set the data in the exposure apparatuses.

As described above, the exposure apparatus using an immersion liquid according to the embodiment can parallel-execute alignment measurement and an exposure process. This arrangement can increase the throughput of the exposure apparatus.

In the exposure apparatus according to the embodiment, the immersion liquid dropping unit 10, pressure feed device 410, flow control device 411, and temperature control device 412 are arranged in air other than the exposure area. This facilitates maintenance, and the like, for these devices which treat the immersion liquid.

Modification 1

Figure 10:
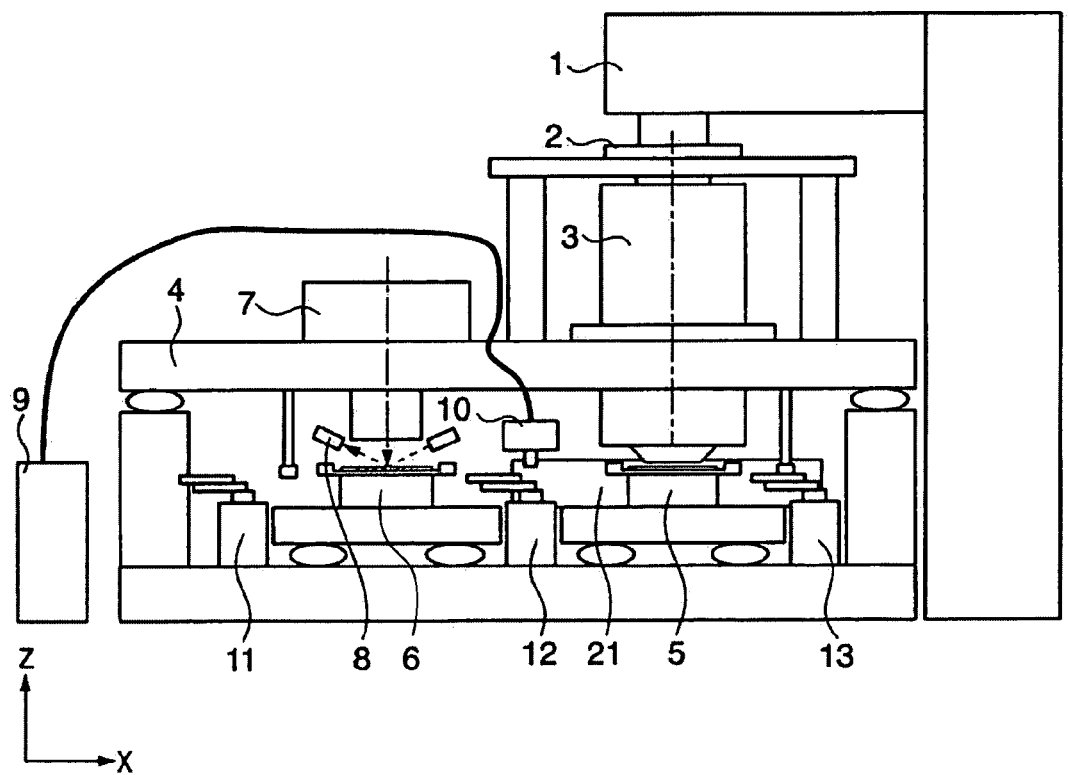
FIG. 10 is a view showing modification 1 to an arrangement of immersing a wafer 20 to be exposed in the immersion liquid.

FIG. 10 shows modification 1 to the arrangement of immersing the wafer 20 to be exposed in the immersion liquid. In the arrangement (FIG. 4A: the same reference numerals as in FIG. 4A denote the same parts, and a description thereof will be omitted) described in the embodiment, the immersion liquid is dropped from the immersion liquid dropping unit 10 to the wafer chuck to immerse the wafer in the immersion liquid when the wafer chuck 6C is conveyed from the alignment measurement area to the exposure area. Alternatively, for example, the moving unit mechanism of the exposure stage 5 may be sealed for waterproofing, and an immersion liquid bath 21 for immersing the wafer chuck may be arranged in the exposure area. The wafer chuck may be immersed in the immersion liquid so that the wafer is sunk in the immersion liquid within the immersion liquid bath 21. At this time, the immersion liquid dropping unit 10 is controlled by the immersion control unit 404 so as to replenish the immersion liquid bath 21 with the liquid. In modification 1, the immersion liquid is prepared in the exposure area in advance, and no immersion liquid need be dropped onto each wafer. Modification 1 can shorten the time taken to drop the immersion liquid, compared to the embodiment.

Modification 2

Figure 11:
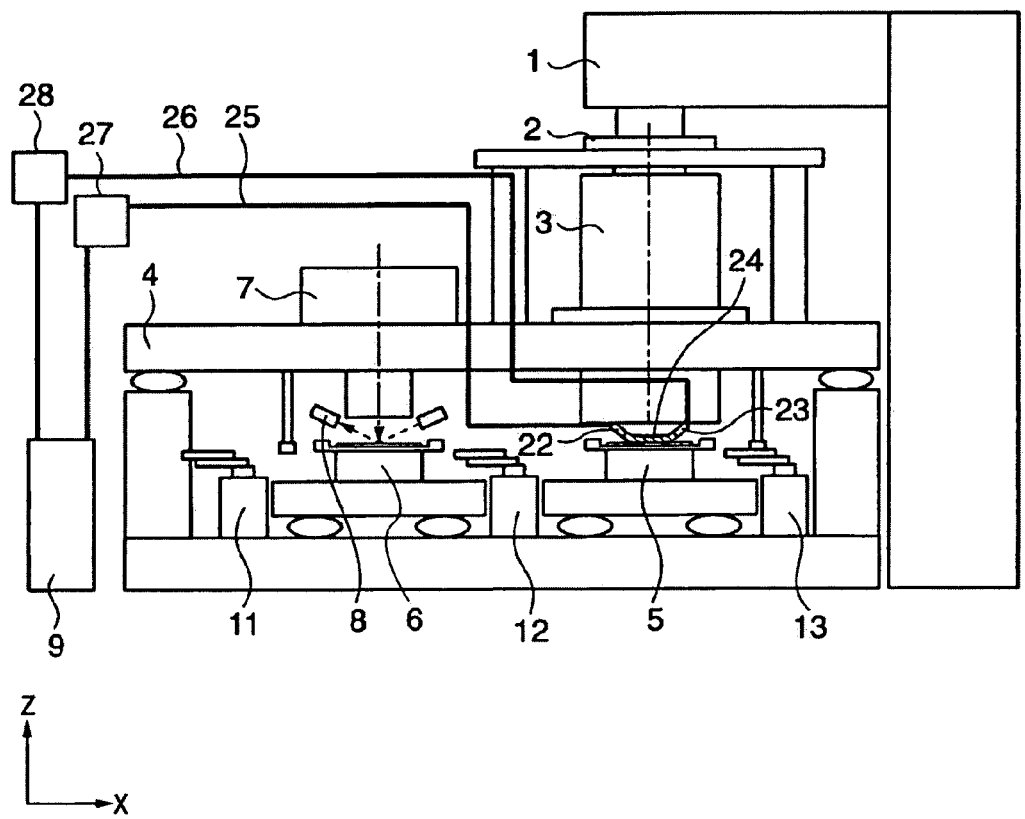
FIG. 11 is a view showing modification 2 to the arrangement of immersing the wafer 20 to be exposed in the immersion liquid.

FIG. 11 shows modification 2 to the arrangement of immersing the wafer 20 to be exposed in the immersion liquid. The immersion liquid tank 9 is connected to an immersion liquid supply pump 27 for supplying an immersion liquid onto a wafer. The immersion liquid 24 may be supplied from an immersion liquid supply nozzle 22 via an immersion liquid supply pipe 25 onto a wafer set in the exposure area, thereby forming a liquid film on the wafer surface. In this case, the supplied immersion liquid is recovered by an immersion liquid recovery pump 28 from an immersion liquid recovery nozzle 23 via an immersion liquid recovery pipe 26, and returned to the immersion liquid tank 9.

In modification 2, only a part to be exposed is immersed in the immersion liquid. Modification 2 can shorten the time taken for immersion in comparison with the embodiment, which immerses the entire wafer in the immersion liquid.

Modification 3

Figure 12A:
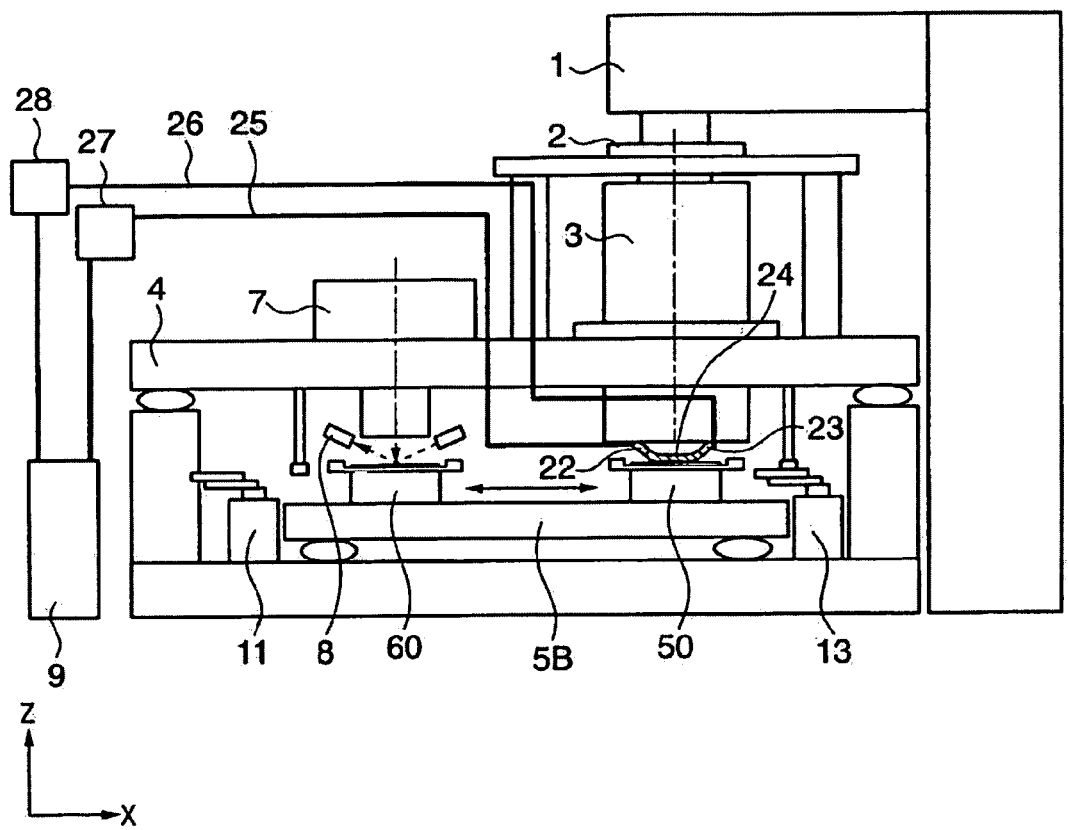
FIGS. 12A and 12B are views showing modification 3 to the arrangement of immersing the wafer 20 to be exposed in the immersion liquid.
Figure 12B:
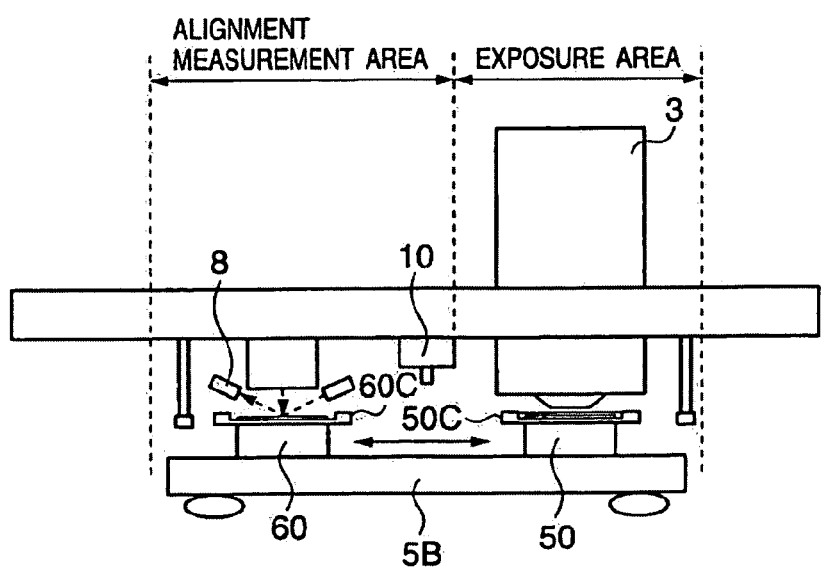

FIGS. 12A and 12B show modification 3 to the arrangement of immersing the wafer 20 to be exposed in the immersion liquid. In modification 2 described above, the wafer chuck 6C is conveyed by the chuck conveyance robot 12, and the wafer is supplied to the exposure area. As shown in FIGS. 12A and 12B, an exposure stage 50 and alignment stage 60 may alternately move between the alignment measurement area and the exposure area.

FIG. 12A shows an arrangement associated with supply and recovery of the immersion liquid to which the arrangement of modification 2 shown in FIG. 11 is applied. However, a combination of the arrangement for moving the wafer chuck and the arrangement for supplying the immersion liquid is not limited to this. For example, as shown in FIG. 12B, the immersion liquid dropping unit 10 may drop the immersion liquid onto a wafer chuck 60C on the alignment stage 60 when the alignment stage 60 moves from the alignment measurement area to the exposure area.

In modification 3, the alignment stage 60 and exposure stage 50, which hold the respective wafer chucks 60C and 60C, alternately move between the areas. This implements movement of the wafer chuck, i.e., a transfer operation of the chuck conveyance robot 12.

Modification 4

Figure 13A:
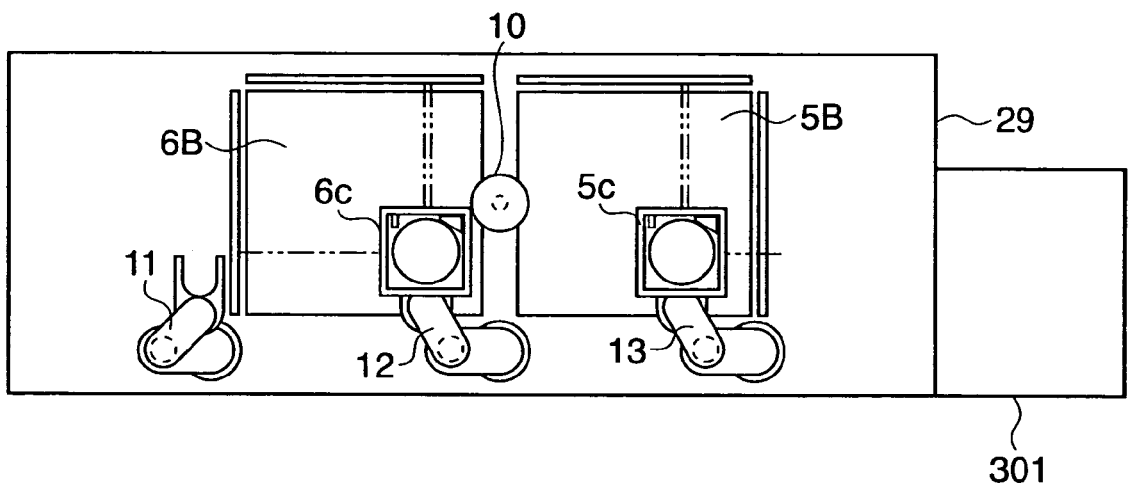
FIGS. 13A to 13C are plan views showing an example of the arrangements of a temperature control chamber and an immersion liquid recovery/drying chamber.
Figure 13B:
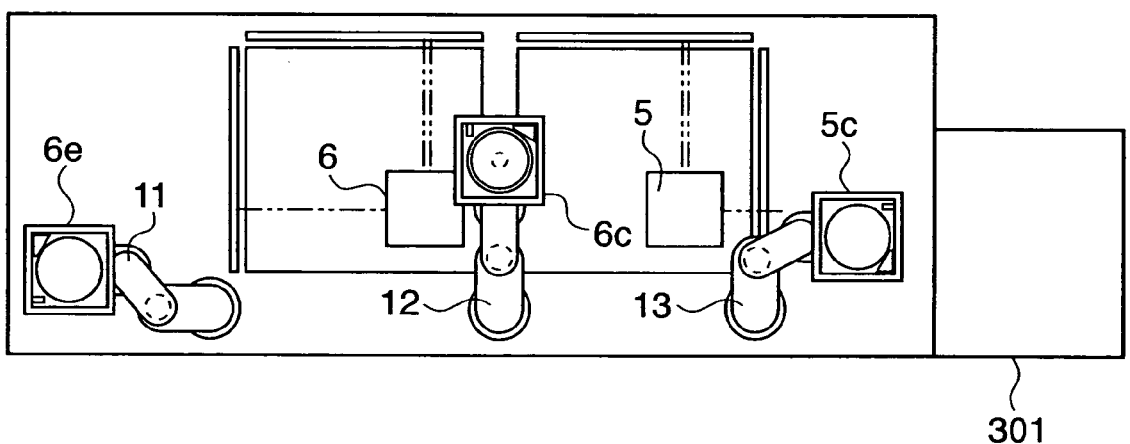
Figure 13C:
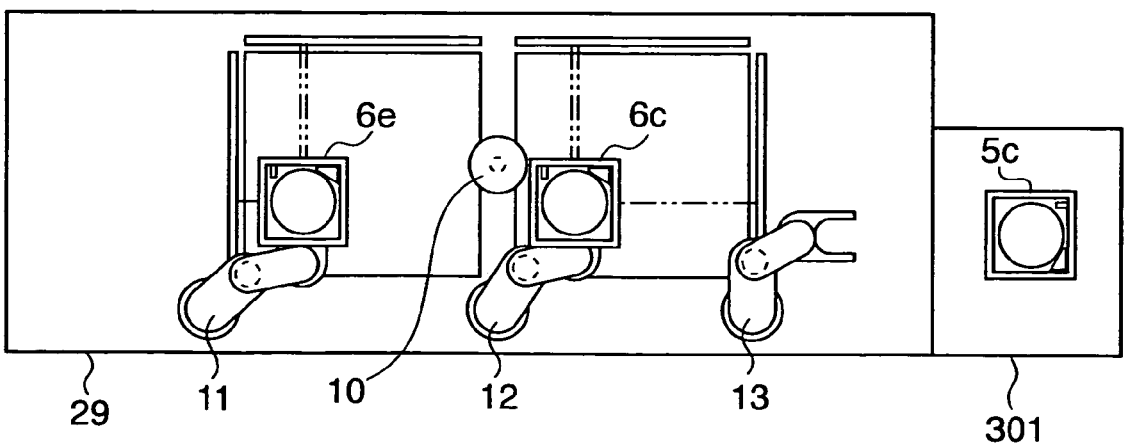

In the above-described embodiment and modifications 1 to 3, temperature rise in drying the immersion liquid and temperature rise in gasifying the immersion liquid influence, as disturbances, processes in the alignment measurement area and exposure area. In order to eliminate this influence, a shielded temperature control space containing the alignment measurement area and exposure area is formed in a temperature control chamber 29. An immersion liquid recovery/drying area is formed in the immersion liquid recovery/drying chamber 301, and the immersion liquid recovery/drying chamber 301 is isolated from the temperature control chamber 29. The environment is managed, so the temperature and temperature rise in recovering and drying the immersion liquid do not influence, as disturbances, processes in the alignment measurement area and exposure area (FIGS. 13A to 13C).

Manufacture of Semiconductor Device

A semiconductor device manufacturing process using the above-described exposure apparatus will be explained. FIG. 14 is a flowchart showing the flow of the whole manufacturing process of a semiconductor device. In step 1 (circuit design), the circuit of a semiconductor device is designed. In step 2 (exposure control data creation), exposure control data for the exposure apparatus is created on the basis of the designed circuit pattern.

In step 3 (wafer formation), a wafer is formed using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

The wafer process in step 4 includes the following steps: a step of oxidizing a wafer surface, a CVD step of forming an insulating film on the wafer surface, an electrode formation step of forming an electrode on the wafer by vapor deposition, an ion implantation step of implanting ions into the wafer, a resist process step of applying a photosensitive agent onto the wafer, an exposure step of transferring a circuit pattern by the above-described exposure apparatus onto the wafer having undergone the resist process step, a developing step of developing the wafer exposed in the exposure step, an etching step of etching the wafer except the resist image developed in the developing step, and a resist removal step of removing the unnecessary resist after etching. These steps are repeated to form multiple circuit patterns on the wafer.

The present invention can be utilized for an exposure apparatus using an immersion liquid, control of the exposure apparatus, and the like. As an effect of the present invention, the productivity of the immersion type exposure apparatus can be increased.

As many apparently widely different embodiments of the present invention can be made without departing from the spirit and scope thereof, it is to be understood that the invention is not limited to the specific embodiments thereof except as defined in the claims.

This application claims priority from Japanese patent Application No. 2003-317323 filed on Sep. 9, 2003, which is hereby incorporated by reference herein.

What is claimed is:

1. An exposure apparatus for exposing a substrate to light via a pattern of a reticle, said apparatus comprising:
   a first substrate stage configured to hold a substrate chuck and the substrate on the substrate chuck and to move in a measurement area;
   a measurement unit arranged in the measurement area and configured to perform alignment measurement and focus measurement for the held substrate to obtain information for positioning the substrate in an exposure area;
   a second substrate stage configured to hold the substrate chuck and the measured substrate on the substrate chuck, to move in the exposure area, and to position the measured substrate based on the obtained information;
   a projection optical system arranged in the exposure area and configured to project the pattern onto the positioned substrate while a gap between said projection optical system and the positioned substrate is filled with liquid;
   a conveyance unit configured to convey the substrate chuck and the measured substrate from said first substrate stage to said second substrate stage;
   a supply unit arranged in an area located between the measurement area and the exposure area and configured to supply the liquid on the measured substrate; and
   a recovery unit arranged in a recovery area to which the substrate is conveyed from the exposure area and configured to recover the liquid from the substrate onto which the pattern is projected in the exposure area,
   wherein said conveyance unit and said supply unit are configured to be controlled so that said supply unit supplies the liquid on the measured substrate during the conveyance by said conveyance unit of the substrate chuck and the measured substrate from said first substrate stage to said second substrate stage.

2. A method of manufacturing a device, said method comprising steps of:
   exposing a substrate to light via a pattern of a reticle using an exposure apparatus as defined in claim 1;
   developing the exposed substrate; and
   processing the developed substrate to manufacture the device.

3. An apparatus according to claim 1, wherein said recovery unit is arranged in a chamber which differs from a chamber for arranging the measurement area and the exposure area.

4. An apparatus according to claim 1, wherein said recovery unit is arranged in a chamber which differs from a chamber for arranging the measurement area, the exposure area and the area in which the supply unit is arranged.

5. An exposure apparatus for exposing a substrate to light via a pattern of a reticle, said apparatus comprising:
   a first substrate stage configured to hold a substrate and to move in a measurement area and an exposure area;
   a measurement unit arranged in a measurement area and configured to perform alignment measurement and focus measurement for a substrate held by said first substrate stage to obtain information for positioning the held substrate in the exposure area;
   a projection optical system arranged in the exposure area and configured to project the pattern onto the measured substrate positioned by said first substrate stage based on the obtained information, while a gap between said projection optical system and the positioned substrate is filled with liquid;
   a supply unit arranged in an area located between the measurement area and the exposure area and configured to supply the liquid on the measured substrate; and
   a recovery unit arranged in a recovery area to which the substrate is conveyed from the exposure area and configured to recover the liquid from the substrate onto which the pattern is projected in the exposure area,
   wherein said first substrate stage and said supply unit are configured to be controlled so that said supply unit supplies the liquid on the measured substrate during the movement of said first substrate stage from the measurement area to the exposure area.

6. An apparatus according to claim 5, further comprising:
   a second substrate stage different from said first substrate stage and configured to hold a substrate and to move in the measurement area and the exposure area.

7. An apparatus according to claim 5, wherein said supply unit is arranged in the measurement area.

8. An apparatus according to claim 5, wherein said supply unit is arranged in the exposure area.

9. A method of manufacturing a device, said method comprising steps of:
   exposing a substrate to light via a pattern of a reticle using an exposure apparatus as defined in claim 5;
   developing the exposed substrate; and
   processing the developed substrate to manufacture the device.

10. An apparatus according to claim 5, wherein said recovery unit is arranged in a chamber which differs from a chamber for arranging the measurement area and the exposure area.

11. An apparatus according to claim 5, wherein said recovery unit is arranged in a chamber which differs from a chamber for arranging the measurement area, the exposure area and the area in which the supply unit is arranged.

* * * * *

UNITED STATES PATENT AND TRADEMARK OFFICE
CERTIFICATE OF CORRECTION

PATENT NO. : 7,345,737 B2
APPLICATION NO. : 10/935076
DATED : March 18, 2008
INVENTOR(S) : Yoshikazu Miyajima It is certified that error appears in the above-identified patent and that said Letters Patent is hereby corrected as shown below:

COLUMN 8:
Line 60, "area" should read -- area, --.

COLUMN 11:
Line 14, "an" should read -- and --.

COLUMN 12:
Line 31, "60C," should read -- 50C, --.

Signed and Sealed this

Twenty-third Day of September, 2008

JON W. DUDAS
*Director of the United States Patent and Trademark Office*